United States Patent [19]

Crafts et al.

[11] Patent Number: 5,432,388

[45] Date of Patent: Jul. 11, 1995

[54] REPEATEDLY PROGRAMMABLE LOGIC ARRAY USING DYNAMIC ACCESS MEMORY

[75] Inventors: Harold S. Crafts, Colorado Springs; William W. McKinley, Fort Collins, both of Colo.

[73] Assignee: AT&T Global Information Solutions Company, Dayton, Ohio

[21] Appl. No.: 935,945

[22] Filed: Aug. 27, 1992

[51] Int. Cl.$^6$ .................. H03K 19/173; G06F 7/38
[52] U.S. Cl. .................................... 326/40; 326/38
[58] Field of Search .................. 307/465; 326/38, 46

[56] References Cited

U.S. PATENT DOCUMENTS

| | | | |
|---|---|---|---|
| 4,617,479 | 10/1986 | Hartmann et al. | 307/465 |
| 4,745,579 | 5/1988 | Mead et al. | 307/465 |
| 4,791,603 | 12/1988 | Henry | 307/465 |
| 4,796,229 | 1/1989 | Greer, Jr. et al. | 307/465 |
| 4,930,097 | 5/1990 | Ledenbach et al. | 364/716 |
| 4,930,098 | 5/1990 | Allen | 364/716 |
| 4,935,734 | 6/1990 | Austin | 307/465 |
| 4,940,909 | 7/1990 | Mulder et al. | 307/465 |
| 4,959,564 | 9/1990 | Steele | 307/465 |
| 5,099,150 | 3/1992 | Steele | 307/465 |
| 5,111,079 | 5/1992 | Steele | 307/465 |
| 5,202,592 | 4/1993 | Yoneda et al. | 307/465 |

FOREIGN PATENT DOCUMENTS 121647 10/1984 European Pat. Off. .
253530 1/1988 European Pat. Off. .
2291720 3/1990 Japan .

Primary Examiner—Edward P. Westin
Assistant Examiner—Richard Roseen
Attorney, Agent, or Firm—Wayne P. Bailey; Gregory A. Welte; Douglas S. Foote

[57] ABSTRACT

A typical Programmable Logic Array (PLA) provides an available logic function, or precursor, which a user modifies to obtain a desired logic function. For example, the precursor may be $(A \cdot \bar{A} \cdot B \cdot \bar{B}) + (A \cdot \bar{A} \cdot B \cdot \bar{B})$. The user obtains the desired function, such as $(A \cdot \bar{B}) + (\bar{A} \cdot B)$, by blowing fuses inside the PLA. The fuse-blowing physically blocks data signals (such as the deleted A and the deleted B in the first term) from reaching an internal AND gate which performs the "·" operation. However, this fuse-blowing is permanent, and irreversible. In contrast, one form of the invention does the blocking by using a NAND gate. That is, the data signal, such as the "B," is applied to one input of the NAND gate. A capacitor is connected to the other input. The user stores either a ONE or a ZERO on the capacitor. A ONE blocks the data signal (the output of the NAND cannot change). A ZERO passes the data signal (the output is the inverse of the data signal). Thus, not only is the PLA PROGRAMMABLE, but is also REPEATEDLY PROGRAMMABLE: the signal on the capacitor can be changed.

9 Claims, 16 Drawing Sheets

FPLA
4 IN • 4 OUT • 16 PRODUCTS

FIG. 7 PRIOR ART

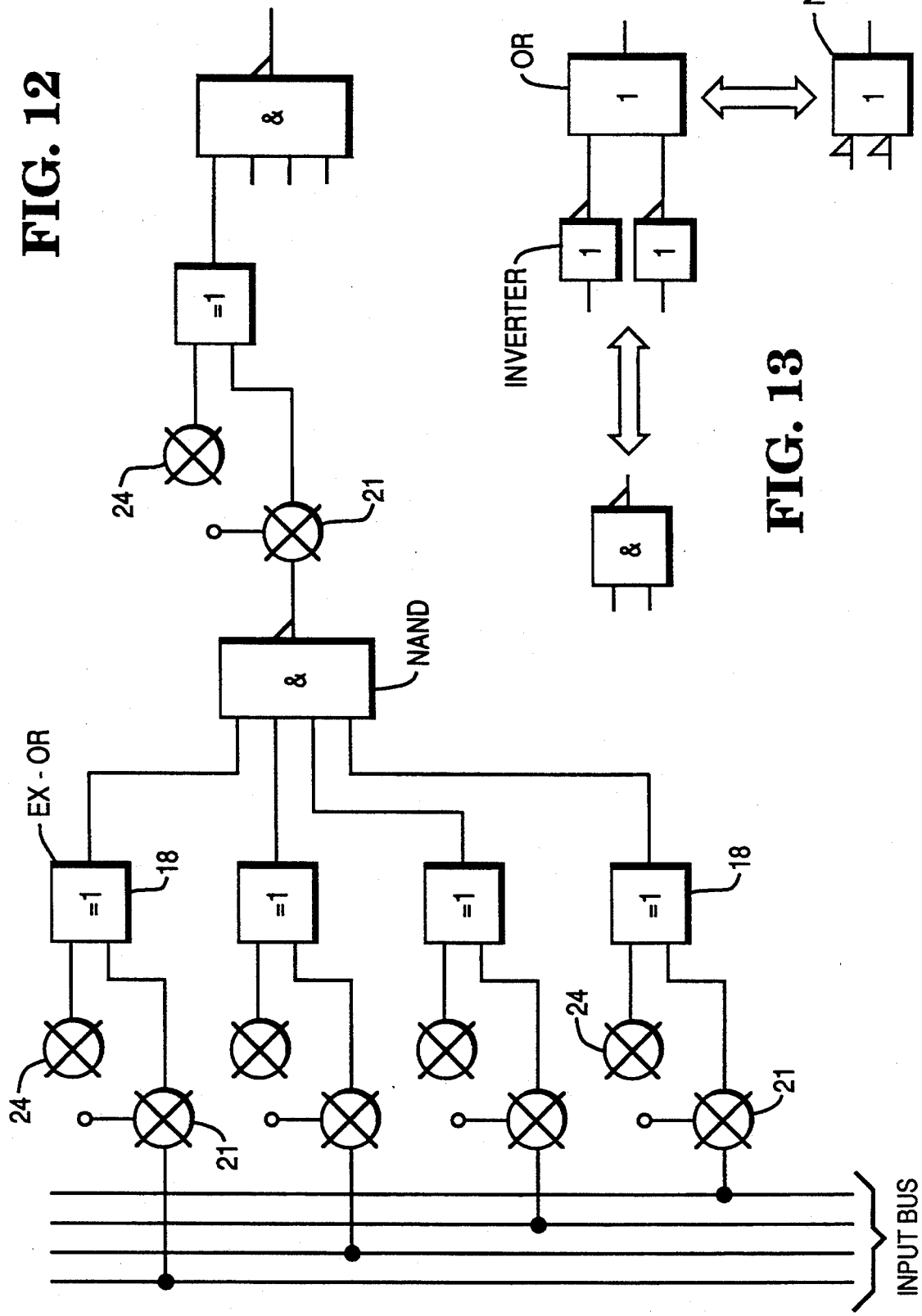

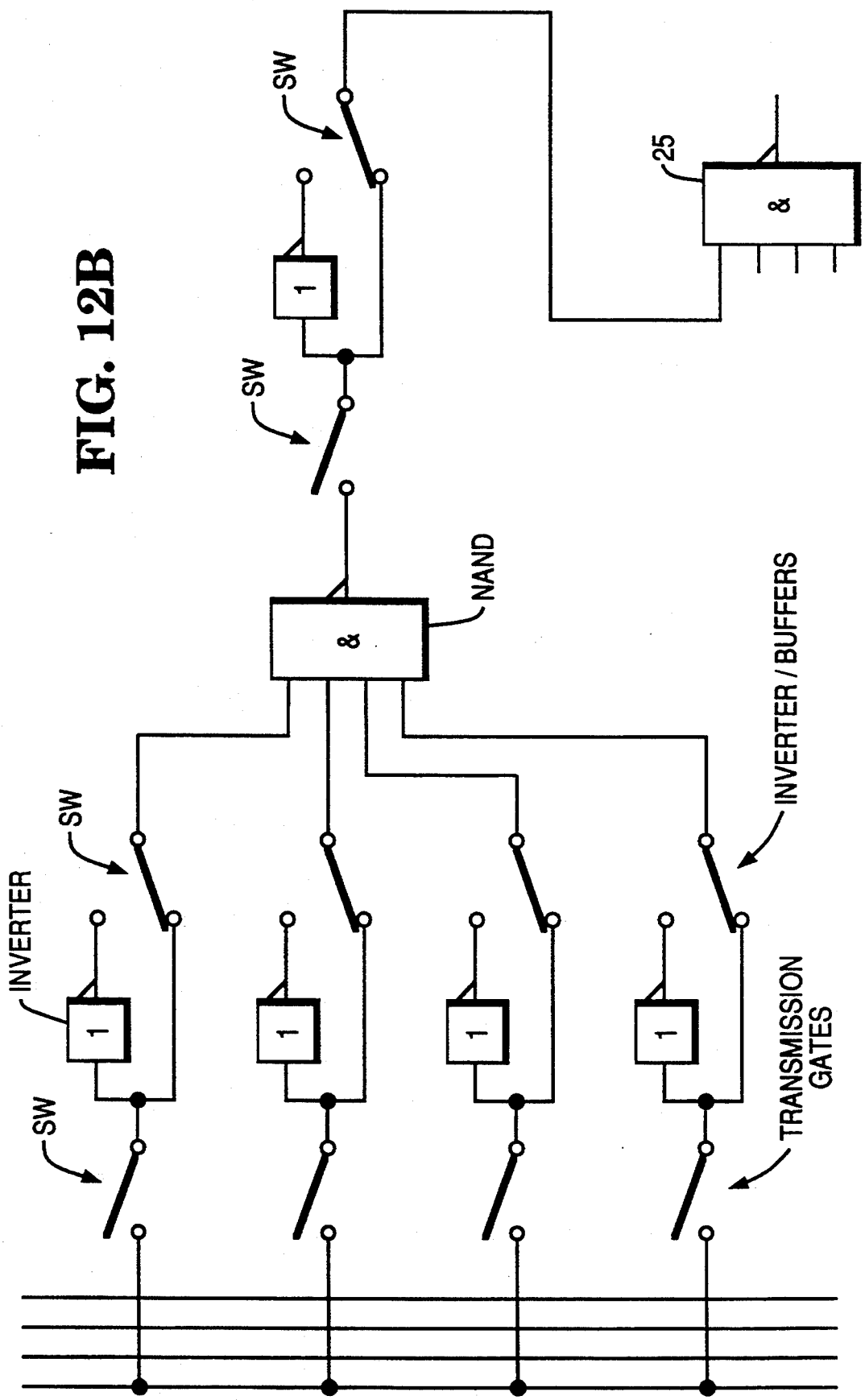

REPEATEDLY PROGRAMMABLE LOGIC ARRAY USING DYNAMIC ACCESS MEMORY

The invention concerns Programmable Logic Arrays which can be programmed to implement a first Boolean function, and then later re-programmed to implement a second Boolean function.

BACKGROUND OF THE INVENTION

Simple PLA

A Programmable Logic Array (PLA) can be explained by reference to FIG. 1. The programming is done by blowing the proper fuses in a fuse bank 3, thus disconnecting nodes N from the respective AND gates 6 and 9. The remaining fuses connect the inputs with the AND gates 6 and 9, forming the circuit.

For example, if fuses 12 are blown, the circuit becomes that shown in FIG. 2. This particular circuit implements the logic function $A \cdot B + \overline{A} \cdot \overline{B}$. (The symbol $\cdot$ means logical AND, while the symbol $+$ means logical OR. The symbol  means logical NOT, or complement.) Other logic functions can be implemented by blowing other combinations of fuses.

In general, with the architecture of FIG. 1, the resulting logic function is a sum (ie, a logical ORing) of product terms. OR gate 4 performs the ORing. The product terms are produced by the AND gates: $A \cdot B$ is one product, and $\overline{A} \cdot \overline{B}$ is the other product. The connections feeding the AND gates, and which result from blowing the fuses, are termed an "AND-array."

The architecture of FIG. 1 is readily expandable to form more complex logic circuits, which implement more complex logic functions, by repeating the circuit, as shown in FIG. 3.

Other PLAs

In addition to the approach of FIG. 3, there are other ways to implement more complex logic functions. For example, FIG. 4 illustrates a Programmable Read Only Memory (PROM) coupled with a programmable OR-array. (FIG. 5 indicates a conventional simplification which has been done in FIG. 4.) The PROM in FIG. 4 acts as the AND-array. The dots 12 in the PROM each indicate connections. The X's in the Or-array indicate fuses which can be blown. The small circles 15 indicate inversions. An example will illustrate the operation.

If the input word $I_3 I_2 I_1 I_0$ is 1001, then the bits on lines $L_7$ through $L_0$, respectively, are 1001 0110. If fuses 16 are blown, as indicated by the dots placed over the X's, the logic functions implemented become $O_3 = I_3 \cdot I_2 \cdot \overline{I_1} \cdot \overline{I_0}$ $O_2 = I_3 \cdot I_2 \cdot I_1 \cdot I_0$ $O_1 = I_3 \cdot I_2 \cdot I_1 \cdot \overline{I_0}$ $O_0 = (I_3 \cdot \overline{I_2} \cdot \overline{I_1} \cdot \overline{I_0}) + (I_3 \cdot I_2 \cdot \overline{I_1} \cdot I_0)$.

The output word $O_3 O_2 O_1 O_0$ is 1111.

Another example of a PLA is a Field-Programmable Logic Array, FPLA, as shown in FIG. 6. This FPLA is the same as the PROM-PLA of FIG. 4, with the exception that the location of the "dots" (ie, connections) in the AND-array of FIG. 6 can be selected, because the crosses in FIG. 6 represent fuses. That is, the AND-array is programmable, in contrast to the AND-array of FIG. 4, which is not.

Yet another example of programmable logic is a Programmable Array Logic (PAL), as shown in FIG. 7. In a sense, the PAL is the converse of the PROM-PLA of FIG. 4: in the PROM-PLA, the "AND" array is pre-programmed, and the OR-array is programmable. In the PAL of FIG. 7, the "AND" array is programmable, and the OR-array is pre-programmed.

Still another type of programmable logic is found in Programmable Gate Arrays, which use a static Random Access Memory (RAM), in the form of an Electrically Erasable and Programmable Memory (EEPROM). The RAM takes the place of the PROM in FIG. 4.

Each type of PAL or PLA (collectively termed "PLAs" herein) has advantages and disadvantages. One disadvantage occurs during development of products which use the PLAs. Frequently, the developer does not know the precise logic function which is needed, and derives the function by trial-and-error, by repeatedly programming PLAs. This repeated programming is time-consuming, and also wastes the incorrectly programmed PLAs. Reprogramming is also required when the logic function is known, but the developer makes a mistake in programming the PLA.

OBJECTS OF THE INVENTION

It is an object of the invention to provide an improved type of Programmable Array Logic.

It is a further object of the invention to provide a type of Programmable Array Logic which is repeatedly programmable.

SUMMARY OF THE INVENTION

In one form of the invention, the logic function implemented by a PLA is not only programmable, but also repeatedly programmable. The programming is done by loading dynamic memory with programming data. Thus, the logic function which is implemented can be altered.

BRIEF DESCRIPTION OF THE DRAWINGS

FIG. 11 illustrates how the apparatus of FIG. 10 can implement a logic function.

FIGS. 12 and 12A show subsections of FIG. 11.

FIG. 12B is a simplification of FIG. 12.

FIG. 13 illustrates how a NAND gate can be decomposed, using DeMorgen's theorem.

DETAILED DESCRIPTION OF THE INVENTION

Oversimplified Explanation

Figure 1:
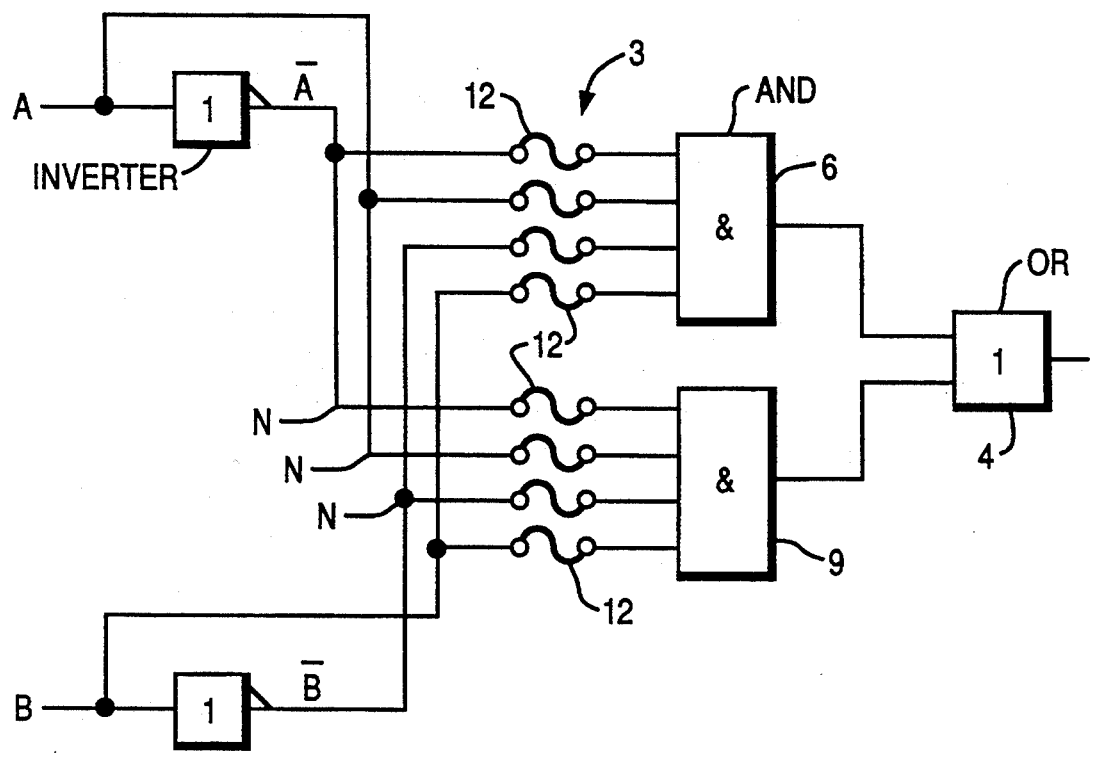
FIG. 1 illustrates a simplified PLA.
Figure 2:
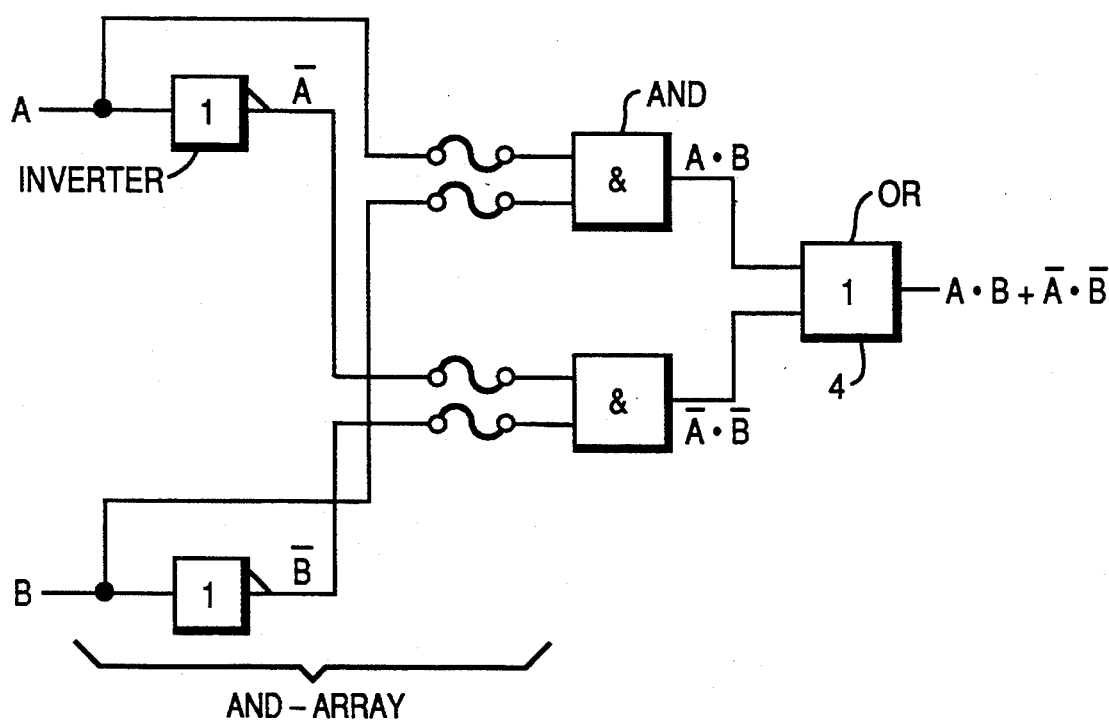
FIG. 2 illustrates one configuration into which the PLA of FIG. 1 can be programmed.
Figure 3:
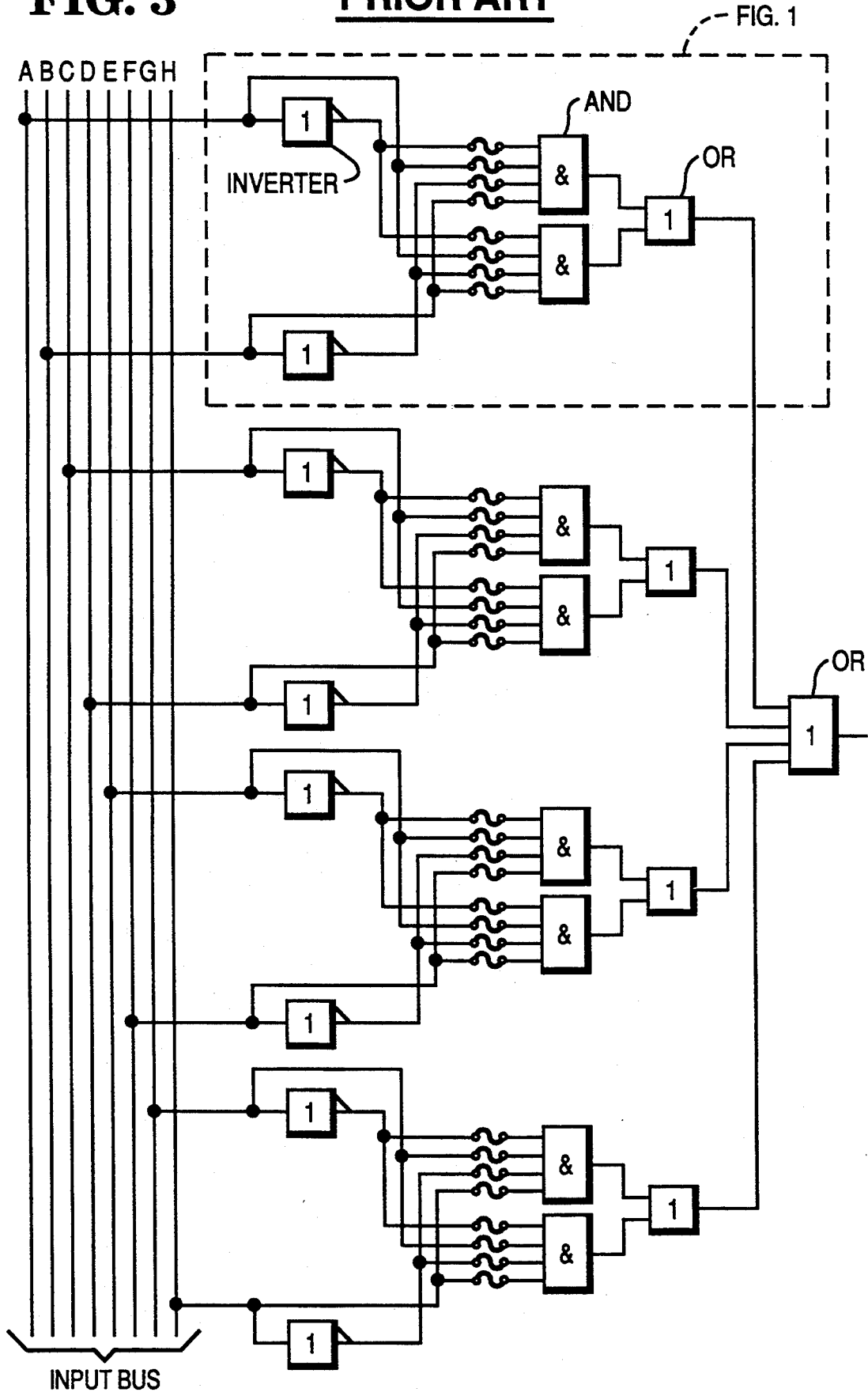
FIG. 3 illustrates how the PLA of FIG. 1 can be expanded to accommodate more complex logic functions.
Figure 4:
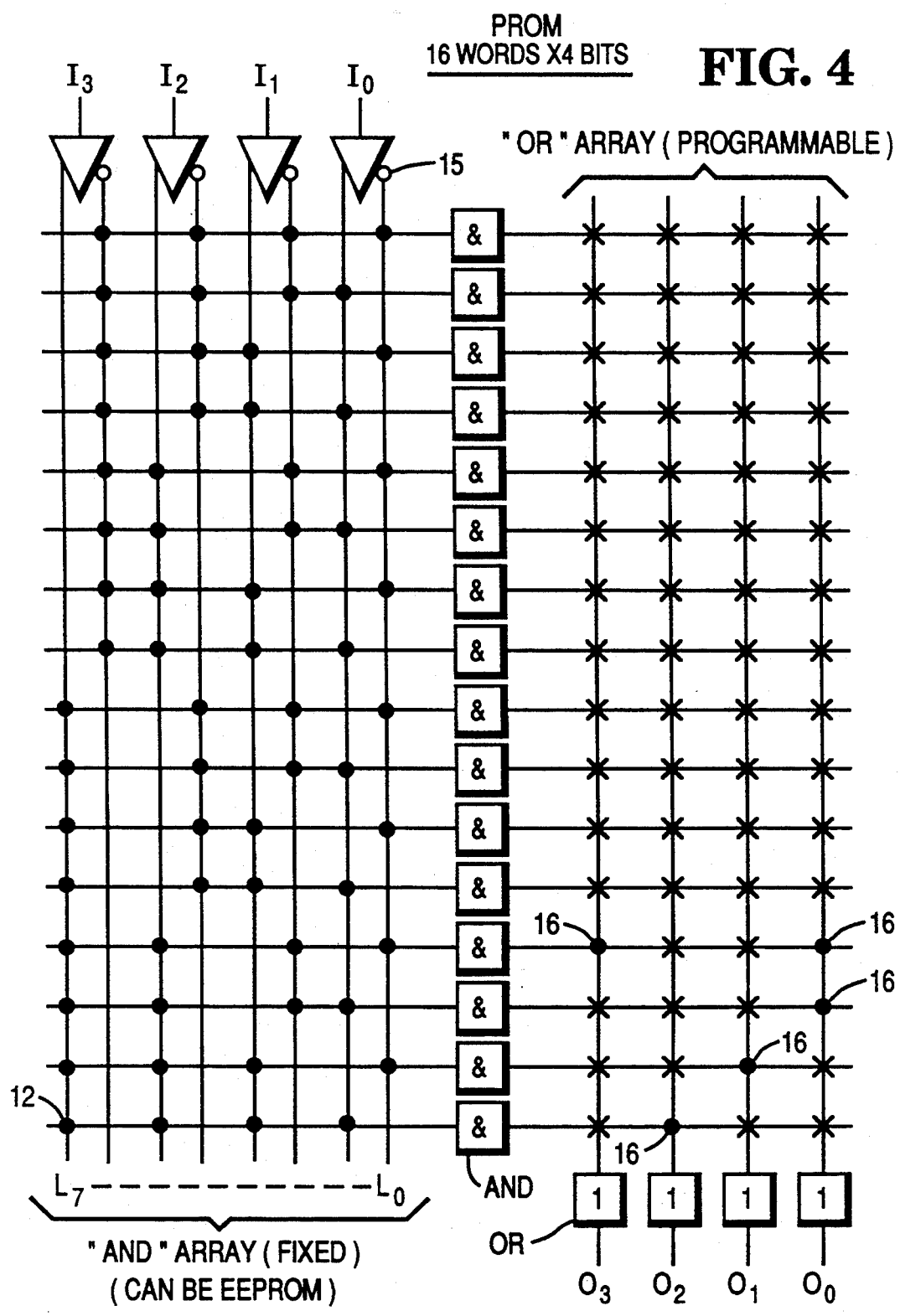
FIGS. 4, 6, and 7 illustrate different types of PLAs.
Figure 5:
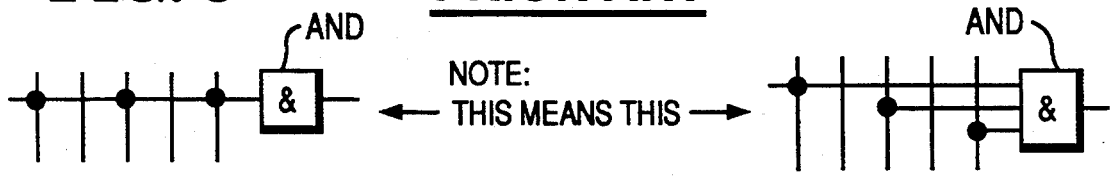
FIG. 5 illustrates a drafting convention used in FIGS. 4, 6 and 7.
Figure 8:
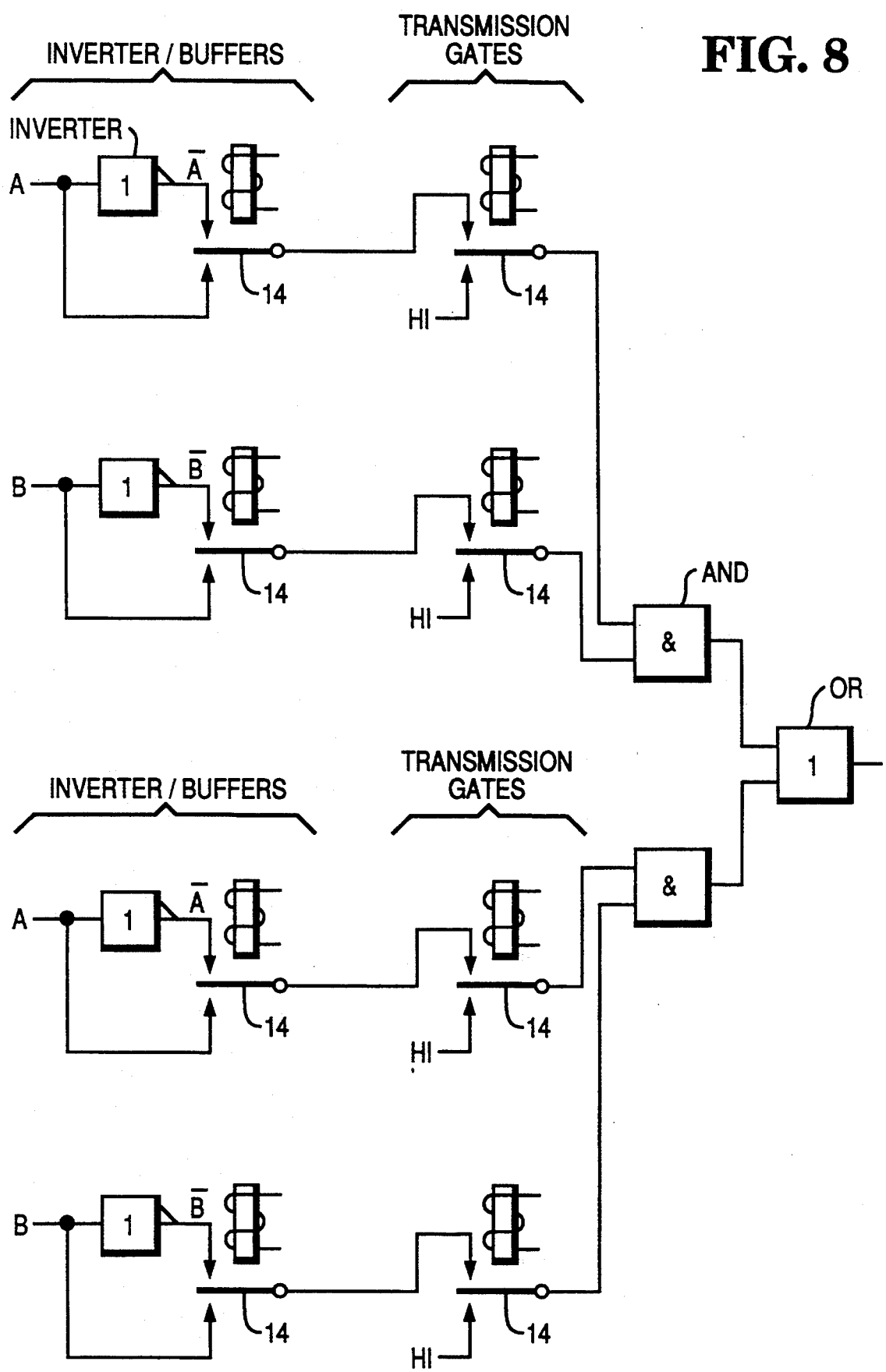
FIG. 8 shows a simplified, schematic form of the invention, wherein relays illustrate switch closures. (Relays are not actually used in the preferred embodiment, but are shown in FIG. 8 for ease of explanation.)

One form of the inventive concept can be explained by reference to FIG. 8, which shows an oversimplified schematic, given for ease of explanation. In FIG. 8, relays are shown, rather than the fuses of FIG. 1. (A closed relay contact corresponds to an intact fuse, and an open relay contact corresponds to a blown fuse.) In FIG. 8, the relay reeds 14 are shown in neutral positions, corresponding to the fact that FIG. 8 shows the hardware in its condition prior to programming.

Figure 9:
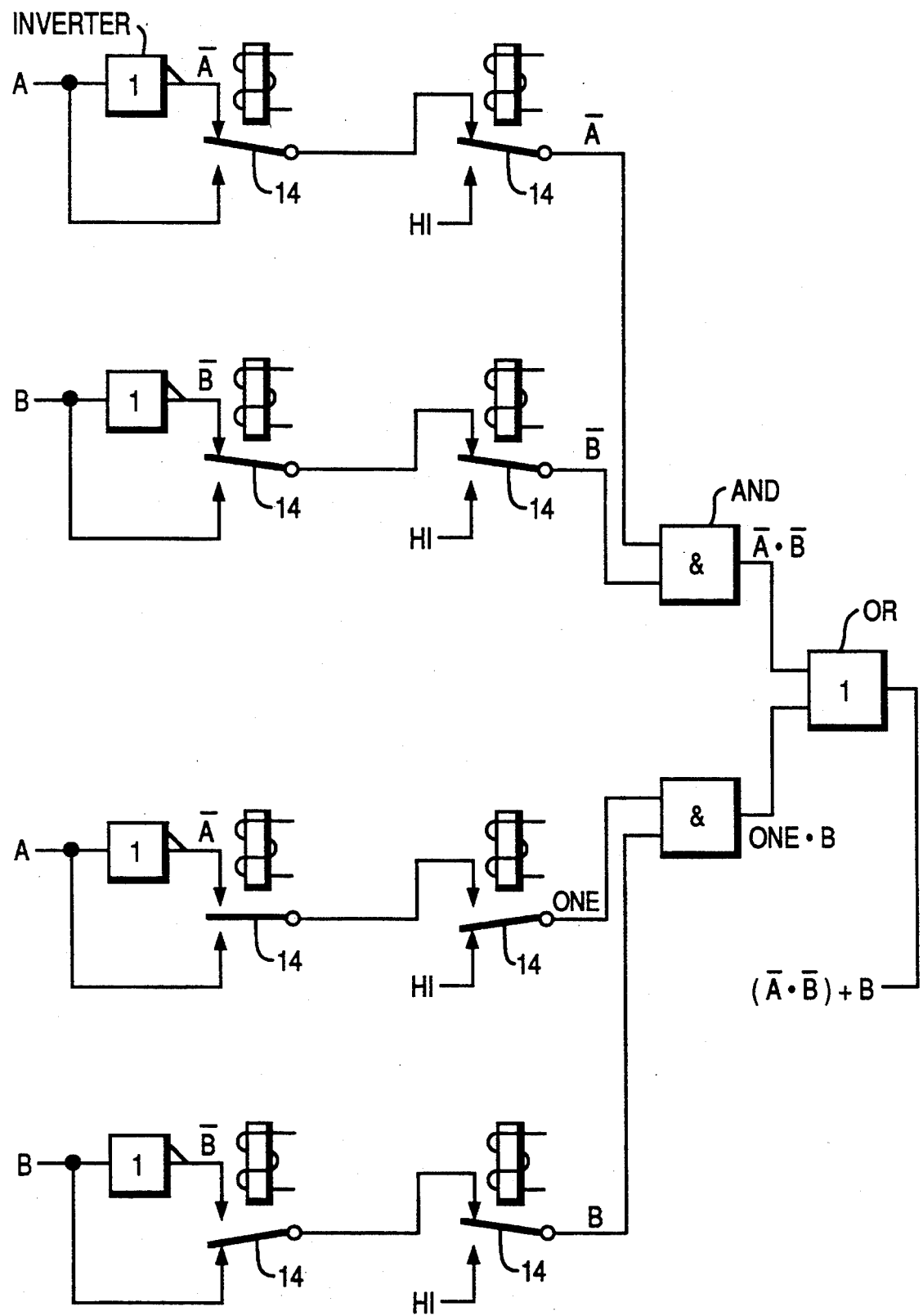
FIG. 9 shows one state into which the relays of FIG. 8 can be programmed.

To implement the function $(A \cdot \overline{B}) + B$, the proper relays would be closed, as shown in FIG. 9. The OR-gate produces the desired function.

The four relays so designated in FIG. 8 act as TRANSMISSION GATES: they either block a signal, or allow the signal to pass. The other four relays are designated as INVERTER/BUFFERS: they either invert the signal, or pass the signal as received.

Unlike the PLAs discussed in the Background of the Invention, the apparatus of FIG. 8 can be re-programmed. If a mistake is made in programming the logic function, or a different function is desired for another reason, reprogramming can be done to obtain a new logic function.

Simplified Version

NAND Gates Replace Transmission Relays

Figure 10:
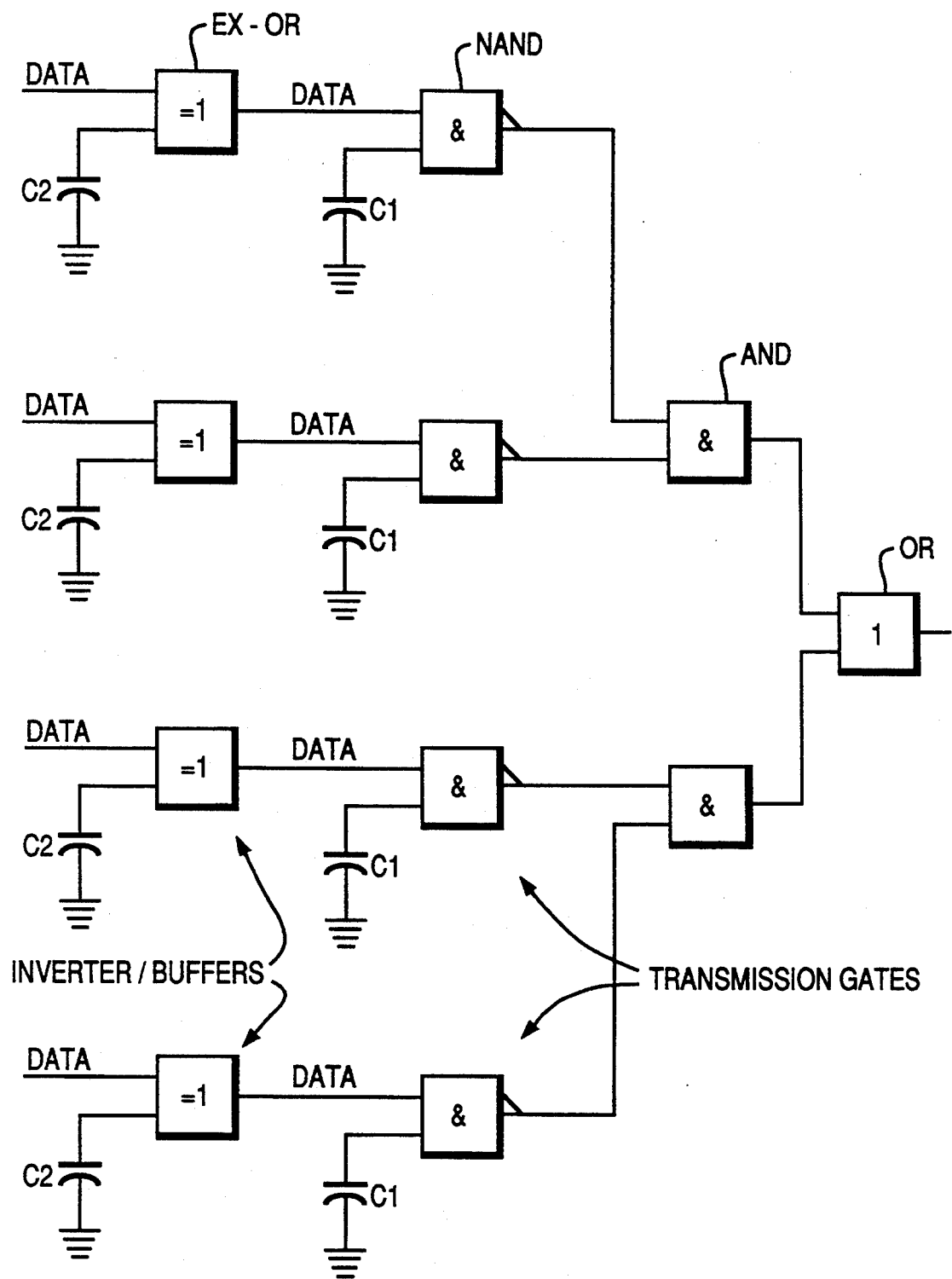
FIG. 10 illustrates logic gates which perform the function of the relays of FIG. 8.

FIG. 8 showed relays for ease of explanation. However, relays are not actually used, as FIG. 10 illustrates. NAND gates, together with capacitors C1, act as TRANSMISSION GATES, instead of the relays designated TRANSMISSION GATES in FIG. 8. The NAND gates operate as follows: when a capacitor C1 is charged, and applies a logic HI to its NAND gate, the output of the NAND gate becomes the inverse of the DATA input, as truth table 1 below indicates, in rows 3 and 4. Conversely, when the capacitor is discharged and applies a LO signal to the NAND gate, the NAND's output is fixed at ONE, as rows 1 and 2 indicate.

TRUTH TABLE 1

| | NAND FUNCTION | | |
|---|---|---|---|
| | INPUTS | | |
| row | Capacitor | DATA Line | OUTPUT |
| 1 | 0 | 0 | — | 1 |
| 2 | 0 | 1 | — | 1 |
| 3 | 1 | 0 | — | 1 |
| 4 | 1 | 1 | — | 0 |

Thus, the NAND gates in FIG. 10 act as TRANSMISSION GATES, by either blocking the signal on its DATA input, or allowing the signal to pass. (As stated above, the signal allowed to pass is the inverse of the incoming signal. A second inversion can be done, if desired, either before or after passage through the NAND gate, to restore the actual logic value. It will be shown later that the EX-OR gates, described below, perform this inversion.)

EX-OR Gates Replace INVERTER Relays

The Exclusive Or (EX-OR) gates in FIG. 10 act either as buffers, or inverting buffers, depending on the signal present on the capacitor C2. That is, as Truth Table 2 indicates

TRUTH TABLE 2

| | EX-OR FUNCTION | | |
|---|---|---|---|
| | INPUTS | | |
| row | Capacitor | DATA Line | OUTPUT |
| 1 | 0 | 0 | — | 0 |
| 2 | 0 | 1 | — | 1 |
| 3 | 1 | 0 | — | 1 |
| 4 | 1 | 1 | — | 0 | when the capacitor carries a signal of ONE, the OUTPUT is the inverse of the DATA line, as rows 3 and 4 indicate. Conversely, when the capacitor carries a signal of ZERO, the output is identical to the input, as rows 1 and 2 indicate. Thus, the EX-OR gate either acts as an INVERTER or a BUFFER, depending on its programming, which, in turn, depends on the charge on the capacitor C2.

MORE COMPLEX VERSION

Figure 11A:
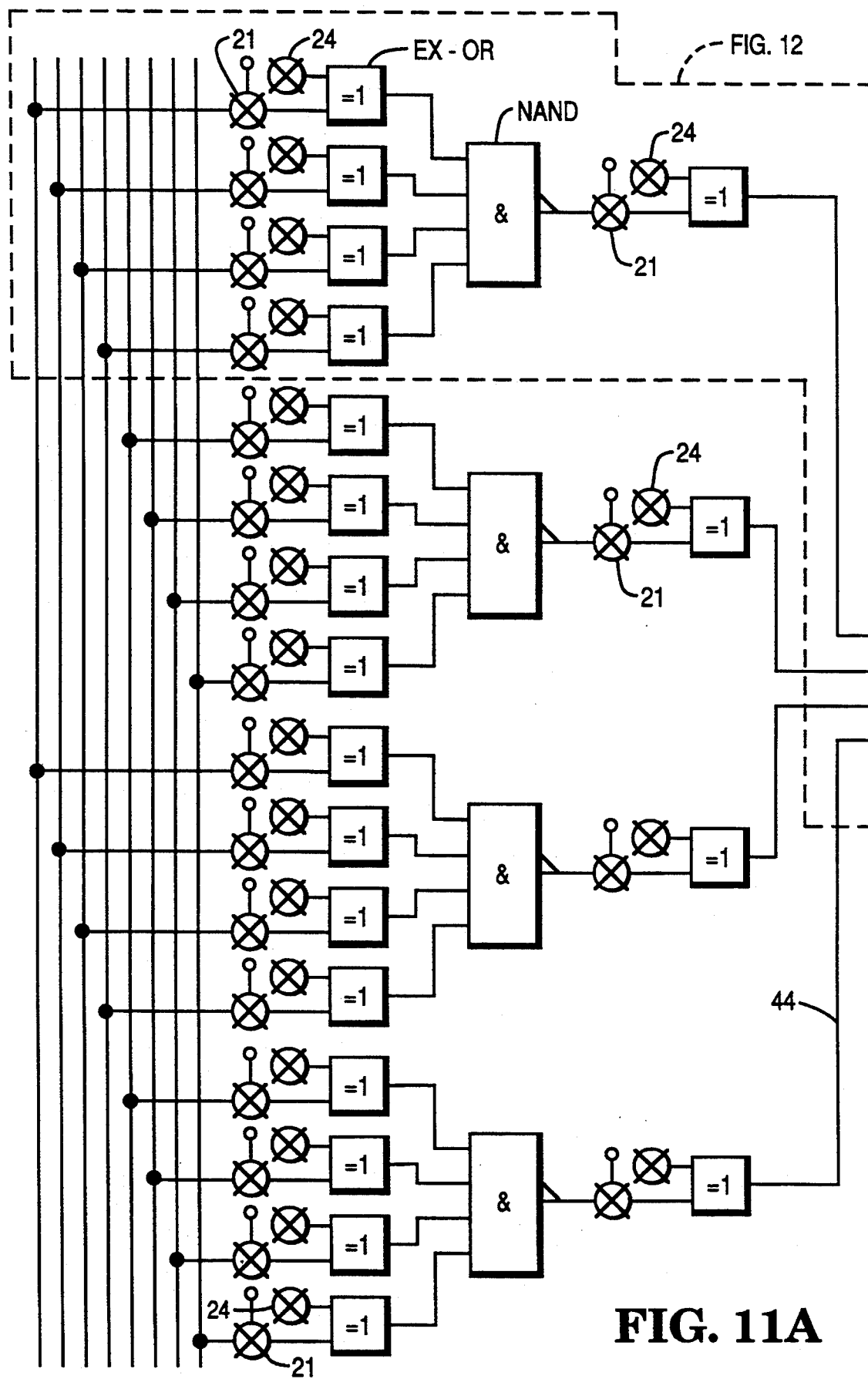
FIGS. 11A and 11B together form FIG. 11.
Figure 11B:
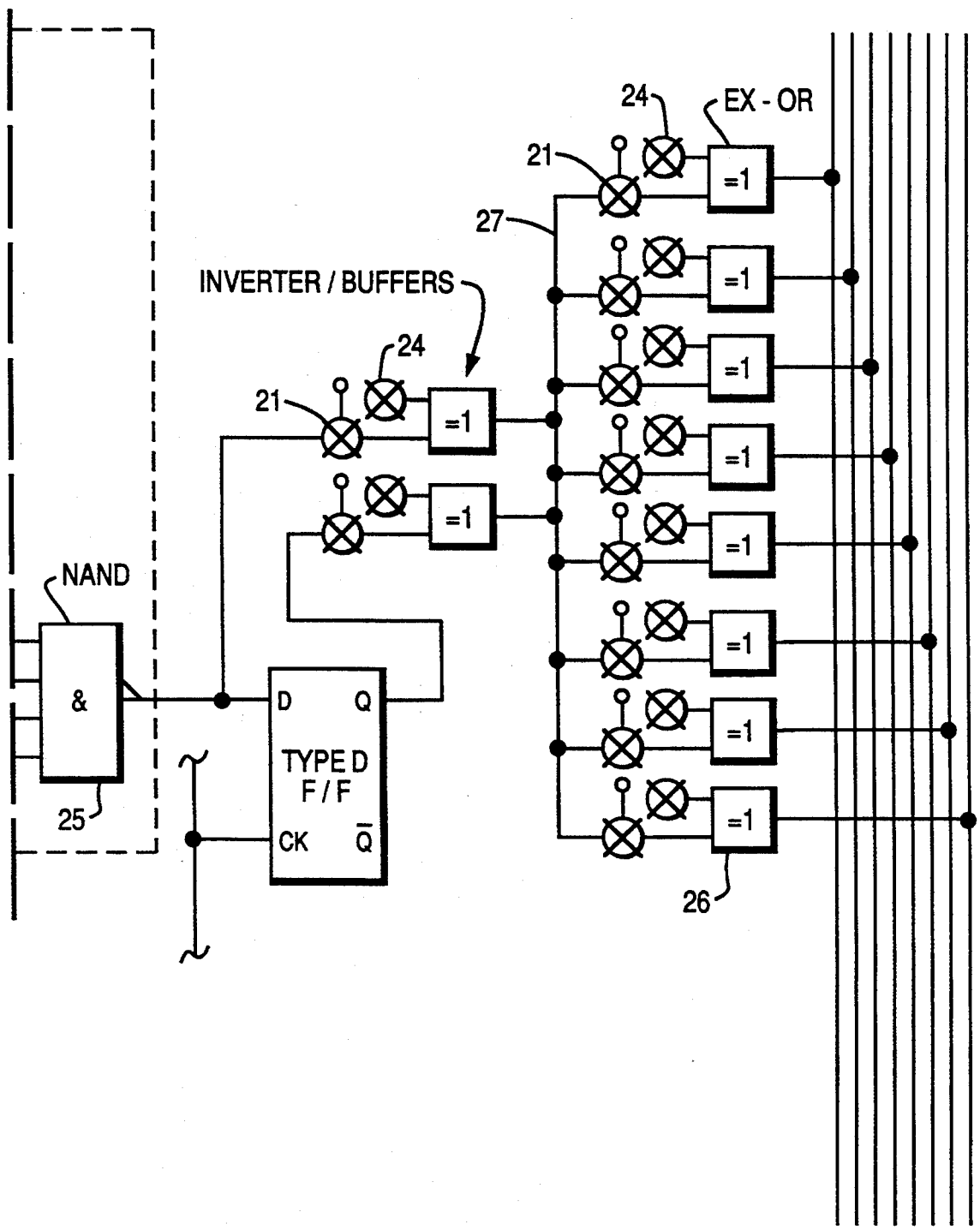

FIG. 11 illustrates how the concepts of FIG. 10 can provide a programmable logic device. A subsection of FIG. 11 is shown in FIG. 12.

Figure 12A:
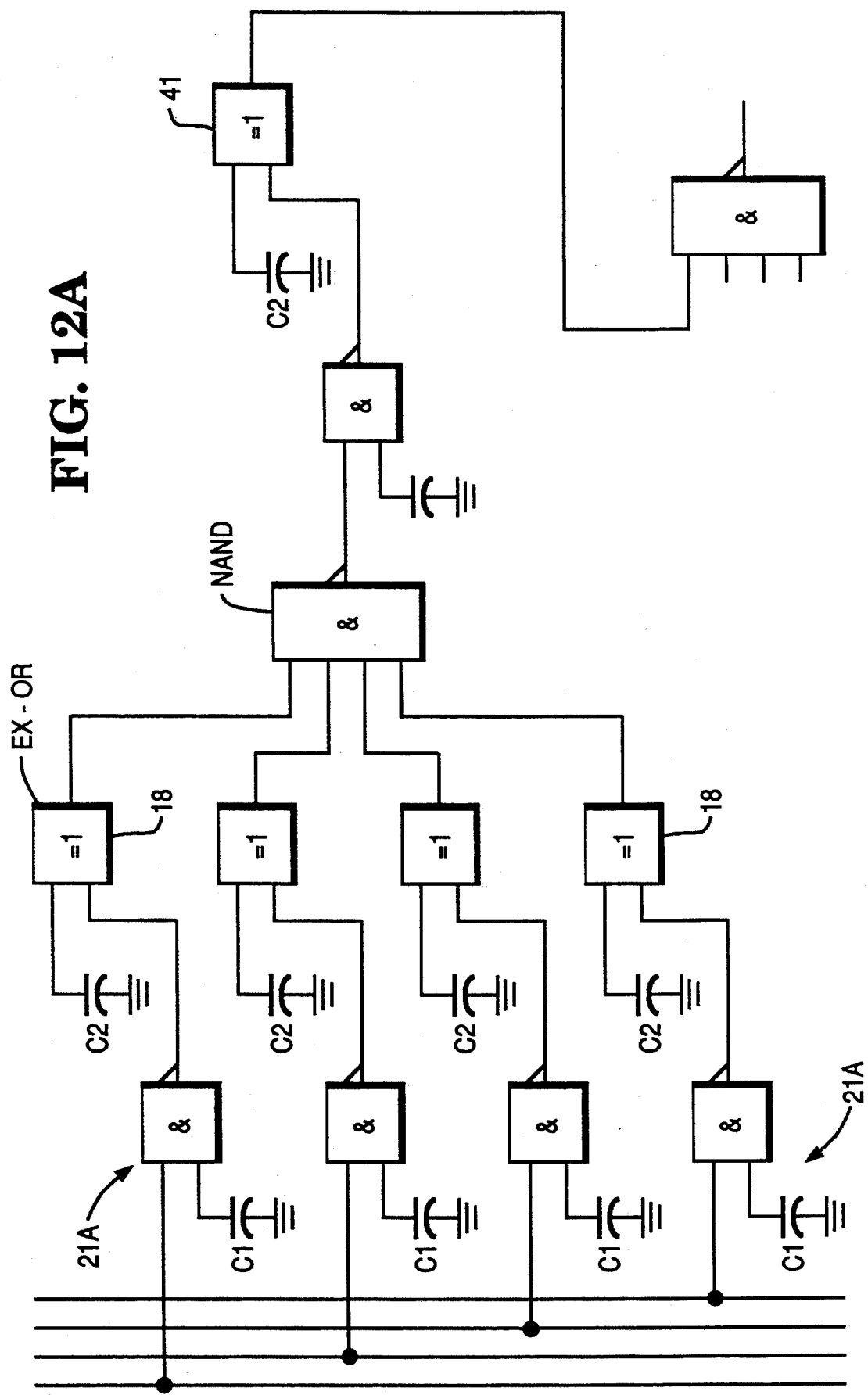

Symbols 21 in FIGS. 11 and 12 indicate a TRANSMISSION GATE, as indicated by the NAND-capacitor combination 21A in FIG. 12A. The TRANSMISSION GATE operates as described in connection with FIG. 10.

Symbols 24 in FIGS. 11 and 12 each indicate a capacitor, such as capacitor C2 in FIG. 12A. The capacitor C2, together with the EX-OR gates 18, operate as INVERTER/BUFFERS, as explained in connection with FIG. 10.

Therefore, the apparatus of FIGS. 12 and 12A can be represented by FIG. 12B. Applying the proper charges to the capacitors C1 and C2, in effect, positions the switches SW in FIG. 12B to implement the desired logic function. The remaining subsections in FIG. 11 are programmed in the same way, and are NANDed in NAND gate 25.

One Application

One application of the logic of FIG. 11 can be to enable or disable selected data lines, in the manner of a decoder. That is, each EX-OR gate 26, located at the right side of FIG. 11, is programmed into either an inverting or a non-inverting mode by the charge placed onto its respective capacitor, indicated by symbol 24. Each TRANSMISSION gate, indicated by symbol 21, is programmed as desired. Then, when line 27 goes HIGH, the output of each properly programmed EX-OR will go HIGH, pulling its line on the BUS HIGH, as would a decoder.

Figure 15A:
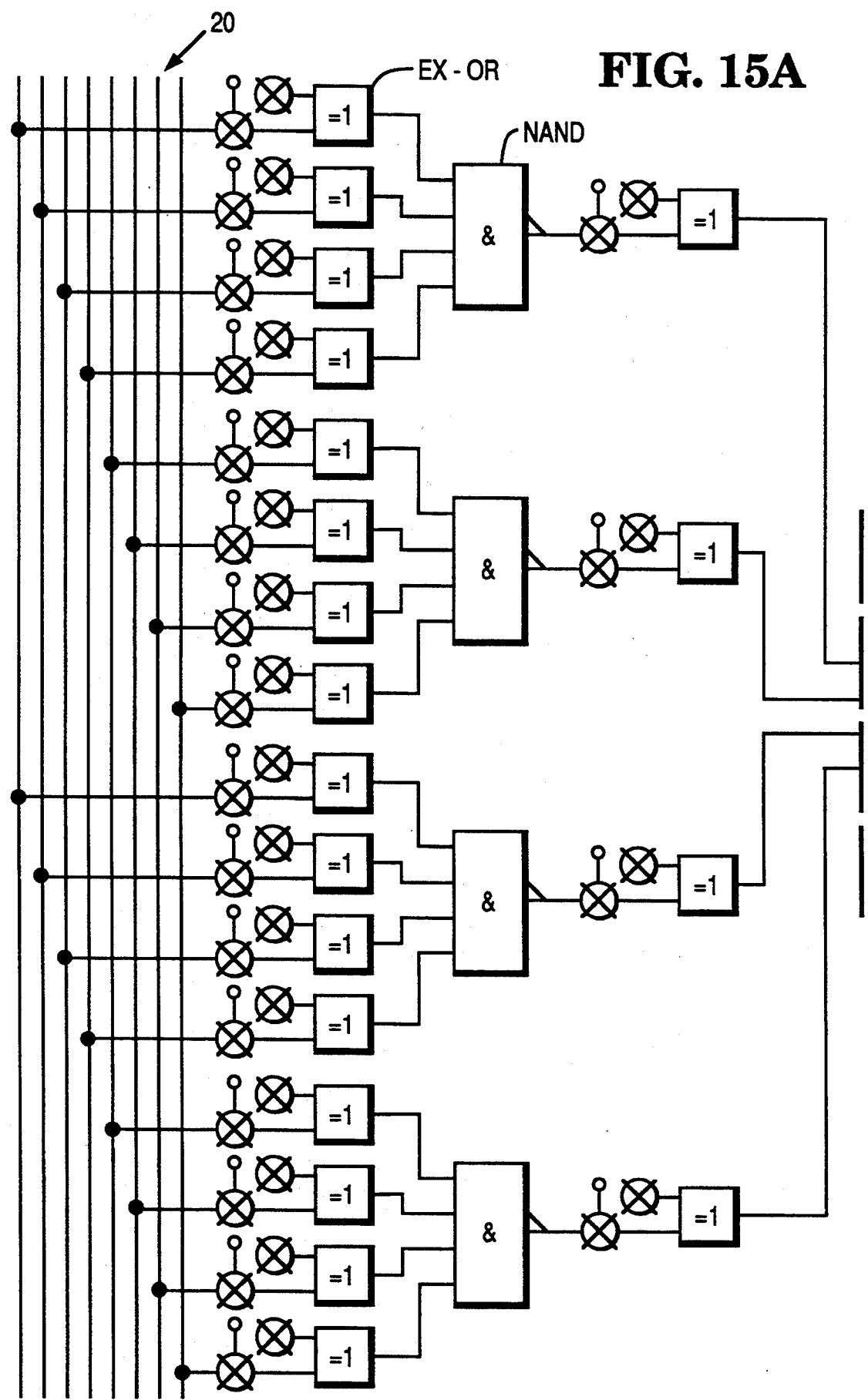
FIGS. 15A and B illustrate another form of the invention.
Figure 15B:
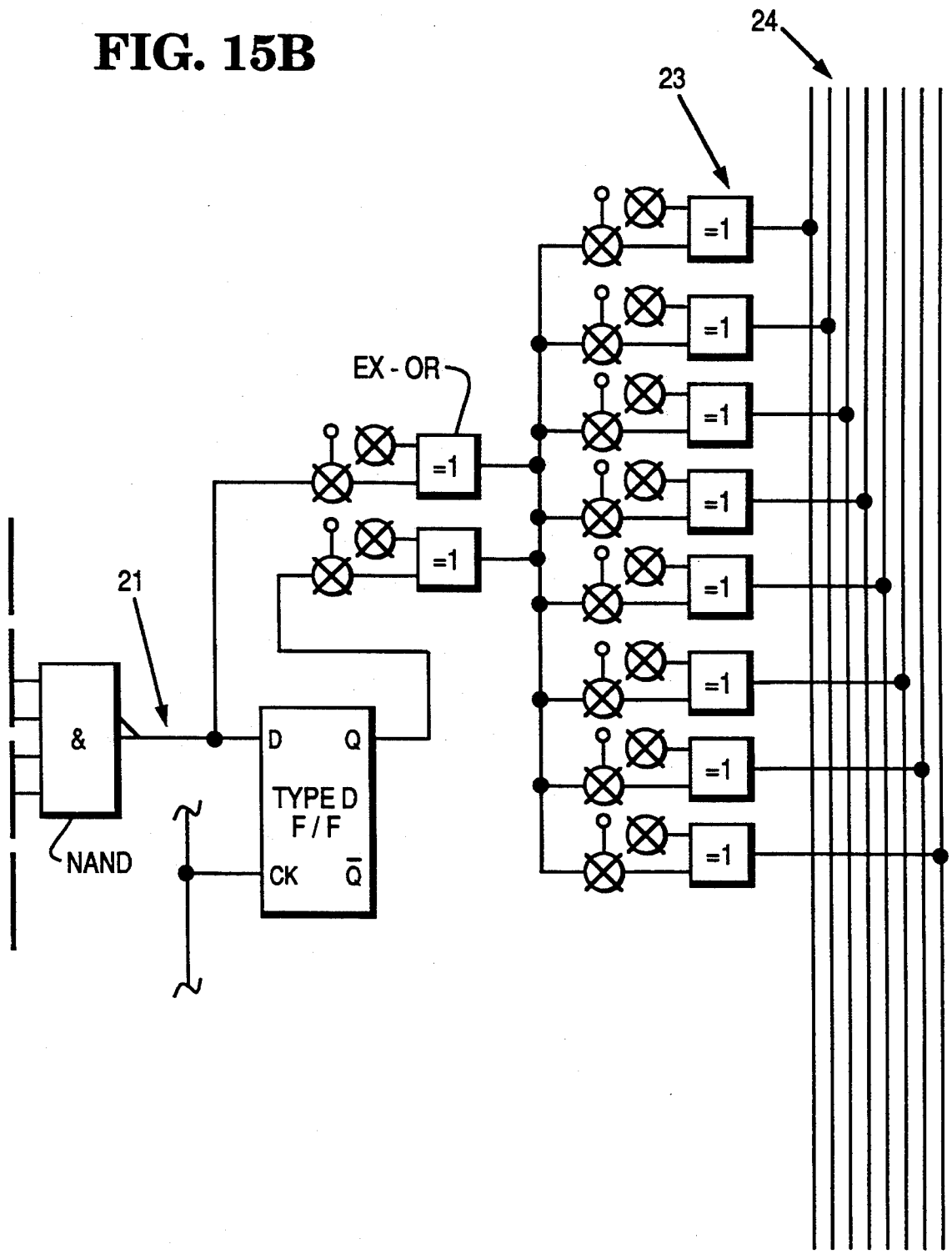

Another explanation can be given, with respect to FIG. 15. The apparatus generates a Boolean function of input variables 20, resulting in a sum of products at node 21. This resulting sum is optionally stored in a type D flip-flop 22. Either the sum at node 21 or the or the stored sum in flip-flop 22 is then transferred to an output buffer 23 which drives the output bus 24.

Mow Programming is Executed

Figure 14:
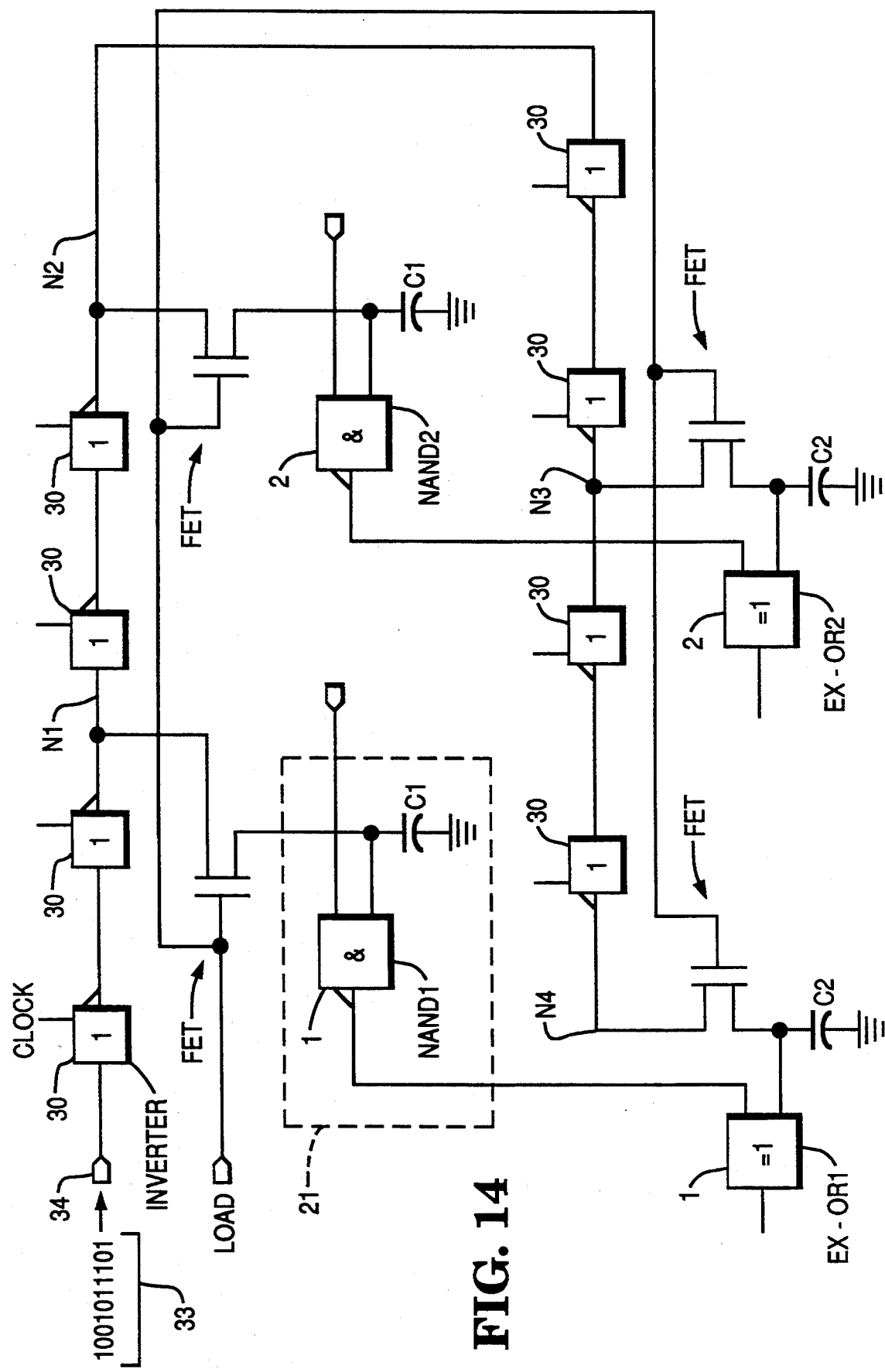
FIG. 14 illustrates one form of the invention.

This discussion will now consider programming of the EX-ORs and the NANDs. In FIG. 14, the inverters 30 collectively act as a shift register. A particular serial bit stream is passed along the shift register, until the desired combination of ONES and ZEROES are present at the respective nodes N1–N4. For example, the combination may be the following:

Node N1—ONE
Node N2—ZERO
Node N3—ZERO
Node N4—ONE.

Then, the LOAD line is pulled HIGH, causing FETs to become conductive and transfer the ONES and ZEROES from nodes to the respective capacitors.

In this example, the gates are programmed as follows:
NAND1—Pass and invert
NAND2—Block: output held HI
EX-OR1—Invert
EX-OR2—Output follows input.

Even though the data-loading is a serial process, large amounts of data can be loaded in a short time. For example, inverters 30 can have a cycle time of 50 nanoseconds. Thus, if 1,048 capacitors are to be programmed, the apparatus of Figure would require 2,096 inverters (two for each capacitor). 2,096 clock cycles will take 104.8 micro-seconds, representing the time for programming the capacitors.

The capacitors can be actual capacitors or, preferably, can take the form of the gate capacitance of an FET contained within either the NAND gates or EX-OR gates. These capacitances will leak charge, and consequently must be refreshed periodically. Refreshing is known in the art. These capacitances thus resemble dynamic serial-access memory.

Figure 6:
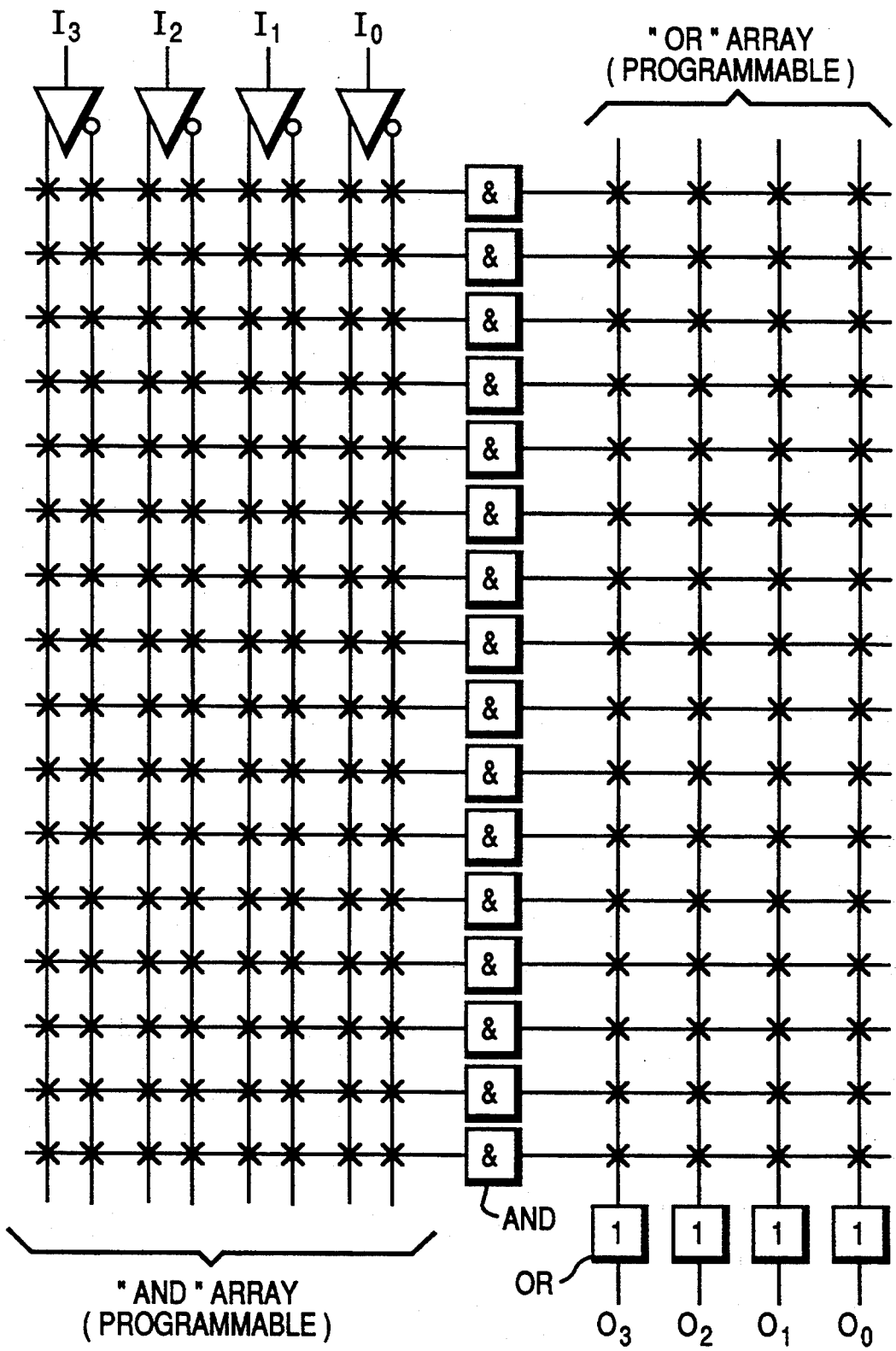
Figure 7:
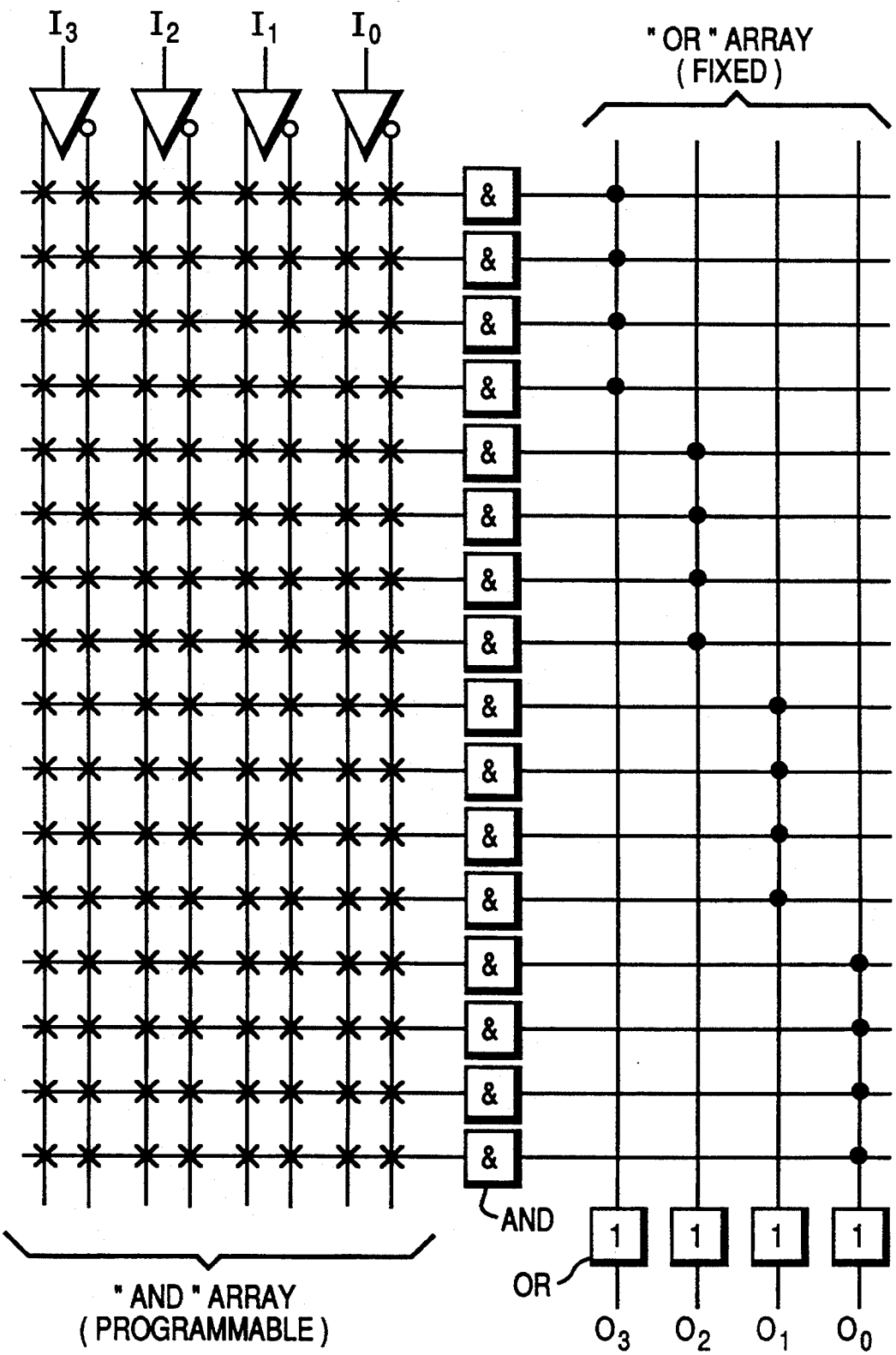

This type of memory (ie, dynamic serial-access) provides an advantage over the PROM or EEPROM indicated in FIG. 6. The advantage lies in the serial access characteristic, which eliminates addressing apparatus, such as decoding schemes, which random-access devices, such as the PROMs and EEPROMs, require. Elimination of the addressing apparatus frees significant space on the integrated circuit carrying the logic apparatus.

From another point of view, the programming of the dynamic memory in FIG. 14 (ie, the capacitors) is performed so infrequently, that the normal advantage of random access (ie, fast access) is not needed.

The data to be loaded onto the capacitors can be stored in many different locations, including a personal computer (PC). The PC can store the data on disc drives, and load the capacitors using an RS232 channel. Serial data transfer using the RS 232 protocol is known in the art.

The inventors point out that the EEPROM devices described in the Background of the Invention can be adapted to perform the reprogramming function described herein. However, the EEPROM is a random access device, possessing the disadvantages described above.

FIG. 11 illustrates a sum-of-products implementation. However, it is well known that any Boolean function can be implemented by either a sum-of-products or product-of-sums. It is further well known that, by DeMorgen's Theorem, a NAND gate is equivalent to ORing of two inputs which are inverted, as shown in FIG. 13. See, for example, M. Morris Mano, *COMPUTER ENGINEERING, Hardware Design*, chapter 2 (Prentice-Hall, 1988) and Thomas Bartree, *Digital Computer Fundamentals*, chapter 3 (McGraw-Hill, 1985). Both of these books are incorporated by reference in their entireties.

Even though the NAND gates 21A in FIG. 12A invert the data when they pass their signals, the inversion can be corrected, if desired (depending on the logic function being implemented), by re-inversion by subsequent EX-ORs or subsequent NANDs.

Invention Can Re-Program Itself

With a given programming, the invention implements a given logic function (or truth table). As stated above, the invention can be re-programmed, unlike many types of PLAs. Further, the invention can be re-programmed during use, and this reprogramming can possibly be done by means of a feedback system, as will now be explained.

Let it be assumed that an external shift register, indicated by the string 33 of ONES and ZEROES in FIG. 14, is connected to line 34. The external shift register 33 is clocked along with the inverters 30. Upon clocking, the bits advance. When the LOAD line is pulled HIGH, the capacitors are loaded with new data, in the form of the now-advanced bits.

If feedback is to be used, the clocking can be done by one of the logic outputs, such as line 44 in FIG. 11.

Views of Invention

From one perspective, the invention selects logical variables present on a bus shown in FIG. 12, by way of the transmission gates shown in FIG. 12B. Then, the invention combines the selected variables into a Boolean function, by using the INVERTER/BUFFERs and NAND gates shown in FIG. 12B, as well as other logic apparatus which are not shown.

From another perspective, the invention shown in FIG. 14, for example, stores programmed data on the capacitors C1. The programmed data determines the particular logic function which is implemented. The programmed data can be loaded by any device capable of supplying a string of ONES and ZEROES to the lead 34, which feeds the shift registers 30. Such devices include personal computers, a static RAM, and, in principle, a bounce-free switch (connected to the lead 34) which a human operator opens and closes at the proper times during the CLOCK pulses.

Once loaded, the data on the capacitors C1 must be refreshed, either by re-loading or by recirculating the shift registers, and closing the FETs when the proper data is present at the nodes N1–N4.

From still another perspective, the invention allows repeated alteration of a pre-existing, available sum-of-products. That is, for the apparatus of FIG. 10, prior to programming, there is no charge on the capacitors $C_1$ or $C_2$. With no charge on any $C_2$, each associated EX-OR gate acts as a buffer and passes the input signal. With no charge on any $C_1$, each associated NAND gate acts as an inverter.

If the proper $C_2$'s are programmed, the signal at the OUTPUT becomes $(I_1 \cdot \bar{I}_1) + (I_2 \cdot \bar{I}_2)$. This is the available, pre-existing sum-of-products. More generally, the available sum-of-products in an actual device would be $(I_1 \cdot \bar{I}_1 \cdot I_2 \cdot \bar{I}_2 \cdot \ldots I_N \cdot \bar{I}_N)_1 + (I_1 \cdot \bar{I}_1 \cdot I_2 \cdot \bar{I}_2 \cdot \ldots I_N \cdot \bar{I}_N)_2 + \ldots + (I_1 \cdot \bar{I}_1 \cdot I_2 \cdot \bar{I}_2 \cdot \ldots I_N)_N$.

The user deletes the terms desired from the available sum-of-products, by programming the appropriate TRANSMISSION GATES, to obtain the desired function. The extension of this procedure to a product-of-sums is clear.

A significant feature of the invention is the use of dynamic random-access memory (DRAM) in a device having the capabilities of a programmable logic array (PLA). DRAM has beneficial features, such as the occupancy of small space on an integrated circuit, compared with other types of memory.

A second significant feature of the invention is the use of conventional technologies in construction of the PLA, which reduces the time required to design and build the devices.

Numerous substitutions and modifications can be undertaken without departing from the spirit and scope of the invention. What is desired to be covered by Letters Patent is the invention as defined in the following claims.

We claim:

1. A programmable logic device, comprising:
   a) means for selecting logical variables from an input bus; and
   b) means for combining the selected variables into a Boolean function, based on reprogrammable data contained in a dynamic access memory loaded by serial access means.

2. A programmable logic device, comprising:
   a) means for selecting logical variables from an input bus; and
   b) means for combining the selected variables into a user-selected Boolean function which is defined by data contained in a dynamic access memory loaded by serial access means.

3. In a method of operating a programmable logic device, the improvement comprising steps in which logical variables are
   a) selected, or selected and inverted, and then
   b) combined into a Boolean function,
   based on reprogrammable data contained in a dynamic access memory loaded by serial access means.

4. In a programmable logic apparatus which receives inputs $I_1, I_2, \ldots I_N$ and provides an available Boolean Sum-of-Products, substantially of the form $(I_1 \cdot \bar{I}_1 \cdot I_2 \cdot \bar{I}_2 \cdot \ldots I_N \cdot \bar{I}_N)_1 + (I_1 \cdot \bar{I}_1 \cdot I_2 \cdot \bar{I}_2 \cdot \ldots I_N \cdot \bar{I}_N)_2 + \ldots + (I_1 \cdot \bar{I}_1 \cdot I_2 \cdot \bar{I}_2 \cdot \ldots I_N \cdot \bar{I}_N)_N$, the improvement comprising:
   means for loading values in a dynamic access memory by a shift register; and
   means for generating the available Sum-of-Products based on at least a portion of the values in the dynamic access memory.

5. In a programmable logic apparatus, in which input bits can be selectively inverted and combined into Boolean expressions of sums and products, the improvement comprising:
   a) a dynamic access memory loaded by serial access means; and
   means for re-programming the programmable logic apparatus, so that different Boolean functions can be implemented, based on data stored in the dynamic access memory.

6. A programmable logic device, comprising:
   a) a bus for carrying logic variables;
   b) means for producing one or more logical product terms, based on a selection of variables and complements derived from the bus;
   c) means for forming a logical sum of the terms; and
   d) a dynamic access memory loaded by serial access means comprising means for altering the selection of variables and complements.

7. A programmable logic device, comprising:
   a) means for receiving a serial bit stream and storing it in a dynamic access memory; and
   b) means for receiving input variables and combining selected input variables into a Boolean expression, based on the stored serial bit stream.

8. A logic device, comprising:
   a) a collection of two-input EXCLUSIVE-OR gates, each having one input connected to a dynamic access memory cell which controls whether the gate acts as an inverter or a buffer;
   b) several NAND gates, each receiving the outputs of a group of EXCLUSIVE-OR gates;
   c) a second collection of EXCLUSIVE-OR gates, each receiving the outputs of a group of the NAND gates; and
   d) a NAND gate receiving the outputs of the second collection of EXCLUSIVE-OR gates.

9. The programmable logic apparatus of claim 4 further comprising means for loading values from the dynamic access memory into the shift register.

* * * * *